United States Patent
Chao et al.

(10) Patent No.: US 8,619,938 B2
(45) Date of Patent: Dec. 31, 2013

(54) CLOCK GENERATION DEVICES AND METHODS

(75) Inventors: Kuan-Hua Chao, Taipei County (TW); Chuan Liu, Hsinchu (TW); Tse-Hsiang Hsu, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 587 days.

(21) Appl. No.: 12/328,819

(22) Filed: Dec. 5, 2008

(65) Prior Publication Data

US 2009/0168943 A1     Jul. 2, 2009

Related U.S. Application Data

(60) Provisional application No. 61/017,186, filed on Dec. 28, 2007.

(51) Int. Cl.
*H04L 7/00* (2006.01)

(52) U.S. Cl.
USPC ........... 375/376; 375/373; 375/356; 375/357; 375/295; 375/354; 375/374; 375/375

(58) Field of Classification Search
USPC ......... 375/376, 373, 356, 357, 295, 354, 374, 375/375
See application file for complete search history.

(56) References Cited

U.S. PATENT DOCUMENTS

| | | | |
|---|---|---|---|
| 5,065,384 A * | 11/1991 | Yokogawa | 369/47.28 |
| 5,483,201 A | 1/1996 | Bortolini | |
| 5,530,389 A | 6/1996 | Rieder | |
| 5,564,042 A * | 10/1996 | Ventrone et al. | 713/501 |
| 6,349,391 B1 | 2/2002 | Petivan et al. | |
| 6,404,246 B1 * | 6/2002 | Estakhri et al. | 327/156 |
| 6,469,553 B1 | 10/2002 | Sung et al. | |
| 6,525,578 B2 * | 2/2003 | Ooishi | 327/156 |
| 6,606,365 B1 | 8/2003 | Chen | |
| 6,795,043 B2 | 9/2004 | Shibata | |
| 7,065,025 B2 | 6/2006 | Kiyose | |
| 7,082,144 B1 * | 7/2006 | Grutter | 370/535 |
| 7,082,177 B2 * | 7/2006 | Arkiszewski | 375/376 |
| 7,103,072 B1 * | 9/2006 | Sloan et al. | 370/503 |
| 7,194,059 B2 | 3/2007 | Wong et al. | |

(Continued)

FOREIGN PATENT DOCUMENTS

| | | |
|---|---|---|
| CN | 1104818 | 7/1995 |
| CN | 1953332 | 4/2007 |
| TW | 200713835 | 4/2011 |
| TW | 200723703 | 7/2011 |

OTHER PUBLICATIONS

Cover page of PCT/JP2005/014360.*

(Continued)

*Primary Examiner* — Siu Lee
(74) *Attorney, Agent, or Firm* — McClure, Qualey & Rodack, LLP

(57) ABSTRACT

A clock generation device provided for a transmitter is provided and comprises a clock generator, a calculator and a first phase locked loop (PLL) circuit. The clock generator generates a first clock signal. The calculator calculates a frequency difference between the first and second clock signals. The first PLL circuit generates an output clock signal according to a first reference clock signal related to the first clock signal, and a frequency of the output clock signal is changed according to the frequency difference. The transmitter transmits data according to the output clock signal.

14 Claims, 5 Drawing Sheets

(56) References Cited

U.S. PATENT DOCUMENTS

| | | |
|---|---|---|
| 7,263,153 B2 | 8/2007 | Sutioso et al. |
| 7,743,168 B2 | 6/2010 | Tang et al. |
| 7,839,965 B2 * | 11/2010 | Wilson et al. ............... 375/358 |
| 2003/0093704 A1 | 5/2003 | Chen et al. |
| 2004/0071251 A1 | 4/2004 | Sutioso et al. |
| 2004/0152427 A1 * | 8/2004 | Chiu et al. .................. 455/85 |
| 2006/0119443 A1 | 6/2006 | Azam et al. |
| 2006/0120489 A1 * | 6/2006 | Lee ........................... 375/344 |
| 2007/0069825 A1 | 3/2007 | Wong et al. |
| 2007/0195916 A1 * | 8/2007 | Itahara ........................ 375/376 |
| 2007/0226531 A1 * | 9/2007 | Park et al. .................... 713/600 |
| 2007/0297553 A1 * | 12/2007 | Sutioso et al. ............... 375/373 |
| 2008/0224782 A1 | 9/2008 | Fan et al. |
| 2009/0033380 A1 | 2/2009 | McCoy |
| 2011/0102258 A1 * | 5/2011 | Underbrink et al. ..... 342/357.47 |

OTHER PUBLICATIONS

English language translation of abstract of CN 1104818 (published Jul. 5, 1995).

English language translation of abstract of CN 1953332 (published Apr. 25, 2007).

* cited by examiner

CLOCK GENERATION DEVICES AND METHODS

CROSS REFERENCE TO RELATED APPLICATIONS

The present application claims the benefit of U.S. provisional application entitled "FLOW AND CIRCUIT FOR FREQUENCY CALIBRATION", Ser. No. 61/017,186, filed Dec. 28, 2007.

BACKGROUND OF THE INVENTION

1. Field of the Invention

The invention relates to a clock generation device, and more particularly to a clock generation device whose output clock signal can be adjusted to be within a frequency ppm range defined by a specification.

2. Description of the Related Art

FIG. 1 shows a conventional transmission device 1, which comprises a transmitter 10, a phase locked loop (PLL) circuit 11, and a clock generator 12. The clock generator 12 generates a reference clock signal CLKref, which is provided to the PLL circuit 11. The PLL circuit 11 generates a clock signal TXCLK according to the reference clock signal CLKref and provides the clock signal TXCLK to the transmitter 10, and the transmitter 10 transmits data with the clock signal TXCLK. Since the clock signal TXCLK is generated according to the reference clock signal CLKref, the frequency ppm range of the clock signal TXCLK is dominated by that of the reference clock signal CLKref. The specification of a high-speed link usually defines a ppm range for frequency of transmitted data. If the frequency of the reference clock signal CLKref does not conform to the defined frequency ppm range of the specification, the frequency of the clock signal TXCLK is hard to conform to the defined frequency ppm range, so that the transmitted data eventually does not meet the specification.

In general, the clock generator 12 is implemented by an on-board clock source, such as a crystal or a resonator. A crystal has a concentrated frequency ppm range; however, compared with a resonator, the crystal has a higher cost. In the other hand, it is difficult controlled the frequency of the resonator, which is a cheaper choice of the clock generator 12, to conform to a frequency ppm range defined by a required specification. Thus, if a resonator is used for implementation for lower costs, it is likely that the frequency of the reference clock signal CLKref will possible not conform to the defined ppm range.

Thus, it is desired to provide a clock generation device for a transmitter, which uses a low-cost reference clock generator and generates a clock signal whose frequency conforms to the frequency ppm range defined by a specification, so that the output data of the transmitter meet the specification.

BRIEF SUMMARY OF THE INVENTION

An exemplary embodiment of a clock generation device provided for a transmitter, which transmits data according to an output clock signal, is provided. The clock generation device comprises a clock generator, a calculator and a first phase locked loop (PLL) circuit. The clock generator is arranged to generate a first clock signal. The calculator is arranged to calculate a frequency difference between the first clock signal and a second clock signal. The first PLL circuit is arranged to generate the output clock signal according to a first reference clock signal related to the first clock signal, and a frequency of the output clock signal is changed according to the frequency difference.

Another exemplary embodiment of a clock generation method for a transmitter is provided. The transmitter transmits data according to an output clock signal provided from a clock generation device. The clock generation method comprises: generating a first clock signal by an on-board clock source of the clock generation device; providing a second clock signal from an external device outside the clock generation device; calculating a frequency difference between the first and second clock signals for calibration of a frequency of the output clock signal.

Another exemplary embodiment of a data transmission method for a transmitter is provided. The data transmission method comprises: calibrating a frequency of an output clock signal for the transmitter according to a frequency difference; and transmitting data according to the calibrated output clock signal. The frequency difference is predetermined according to a precise clock signal before the step of transmitting data.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The embodiments of the invention provide clock generation devices for transmitters. The transmitter is arranged to transmit data according to an output clock signal, and the frequency of the output clock signal is expected to conform to a frequency ppm range defined by a required specification. The clock generation device comprises a clock generator, a calculator, and a phase lock loop (PLL) circuit. The clock generator generates a first clock signal which may have an incorrect frequency. The PLL circuit is arranged to generate the output clock signal according to a reference clock signal related to the first clock signal. The calculator calculates a frequency difference between the first clock signal and a second clock signal, wherein the frequency of the second clock signal conforms to the defined frequency ppm range. The PLL circuit adjusts the frequency of the output clock signal according to the frequency difference, so that the frequency of the output clock signal conforms to the defined frequency ppm range.

Figure 1:
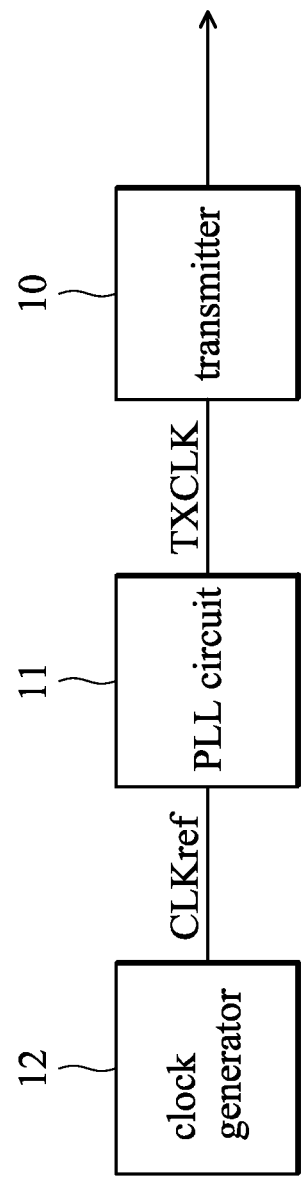
FIG. 1 shows a conventional transmission device with a frequency generator.
Figure 2:
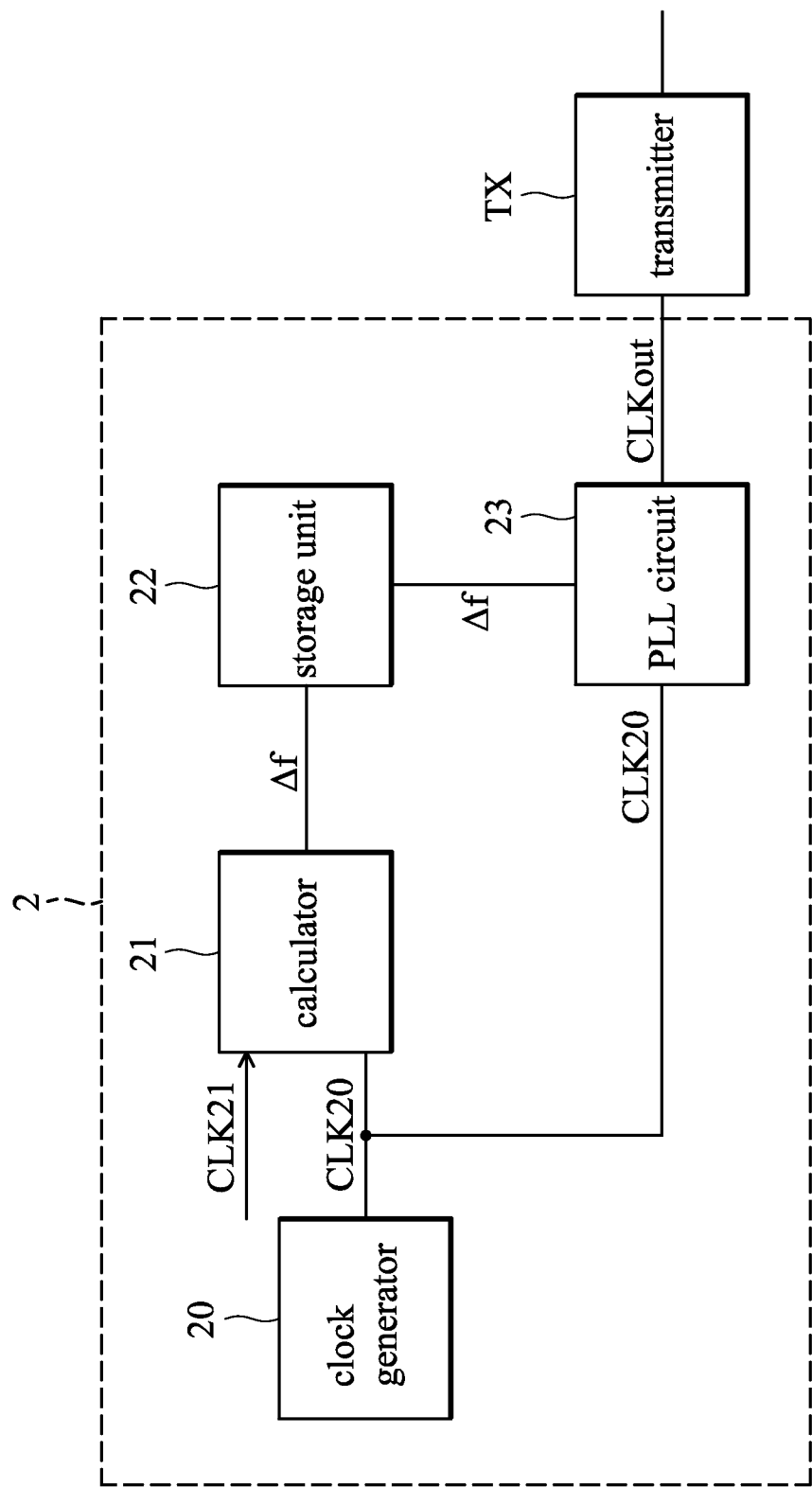
FIG. 2 shows an exemplary embodiment of a clock generation device.

FIG. 2 shows an exemplary embodiment of a clock generation device. A clock generation device 2 is arranged to generate an output clock signal CLKout, and then the output clock signal CLKout is provided to a transmitter TX, wherein the frequency of the output clock signal CLKout is expected to conform to a frequency ppm range defined by a required specification. The transmitter TX transmits data according to the output clock signal CLKout. Referring to FIG. 2, the clock generation device 2 comprises a clock generator 20, a calculator 21, a storage unit 22, and a phase locked loop (PLL) circuit 23. The clock generator 20 generates a clock signal CLK20. The PLL circuit 23 receives the clock signal CLK20 that serves as a reference clock signal and generates the output clock signal CLKout according to the reference clock signal (i.e. the clock signal CLK20).

When the frequency of the clock signal CLK20 does not conform to the defined frequency ppm range, the frequency of the output clock signal CLKout generated based on the clock signal CLK20 usually does not conform to the defined frequency ppm range as well. In the embodiment, the calculator 21 receives the clock signal CLK20 and a precise clock signal CLK21. The calculator 21 calculates a frequency difference Δf between the clock signals CLK20 and CLK21, and the storage unit 22 receives and stores the frequency differenceΔf. The frequency of the clock signal CLK21 accurately conforms to the defined frequency ppm range since the clock signal CLK21 is typically provided from an external device in the embodiment outside the clock generation device 2 rather than an on-board clock or internal generated clock for the clock generation device 2. In other words, the clock signal CLK21 is not generated by an internal device, for example, a clock data recovery circuit which typically generates a clock signal according to the host data received from an external device; on the contrary, the clock signal CLK21 is directly and externally provided from a device outside the system which the clock generation device 2 is located in. More particularly, the clock signal CLK21 is externally provided in the manufacturing or testing of the clock generation device 2 so as to calculate the frequency differenceΔf between the clock signal CLK20 generated by an on-board clock source and the precise clock signal CLK21 before leaving the factory. In normal operation, the PLL circuit 23 adjusts the frequency of the output clock signal CLKout according to the frequency difference Δf initially stored in the storage unit 22, so that the frequency of the output clock signal CLKout is calibrated to conform to the defined frequency ppm range. In other words, the frequency of the output clock signal CLKout is changed according to the frequency difference Δf in order to conform to the defined frequency ppm range. Thus, the data transmitted by the transmitter TX meets the specification. In the embodiment, the frequency of the output clock signal CLKout is adjusted by controlling elements of the PLL circuit 23, such as a divider, and the frequency differenceΔf might be present in various forms, such as an frequency compensation code provided for the divider or other elements in the PLL circuit 23.

In the embodiment of FIG. 2, before a transmitter TX begins to transmits data, the frequency difference Δf is predetermined according to the precise clock signal CLK21, and the frequency of the output clock signal CLKout had been calibrated to conform to the defined frequency ppm range according to the predetermined frequency difference Δf. Thus, the transmitter TX transmits data using the calibrated output clock signal CLKout, and the transmitted data meets the required specification.

In some embodiments, the storage unit 22 is a hardware or a storage medium storing a firmware. The clock generator 20 is implemented by an on-board clock source, such as a crystal or resonator disposed on the same PCB or silicon substrate with other circuits of the clock generation device 2.

Figure 3:
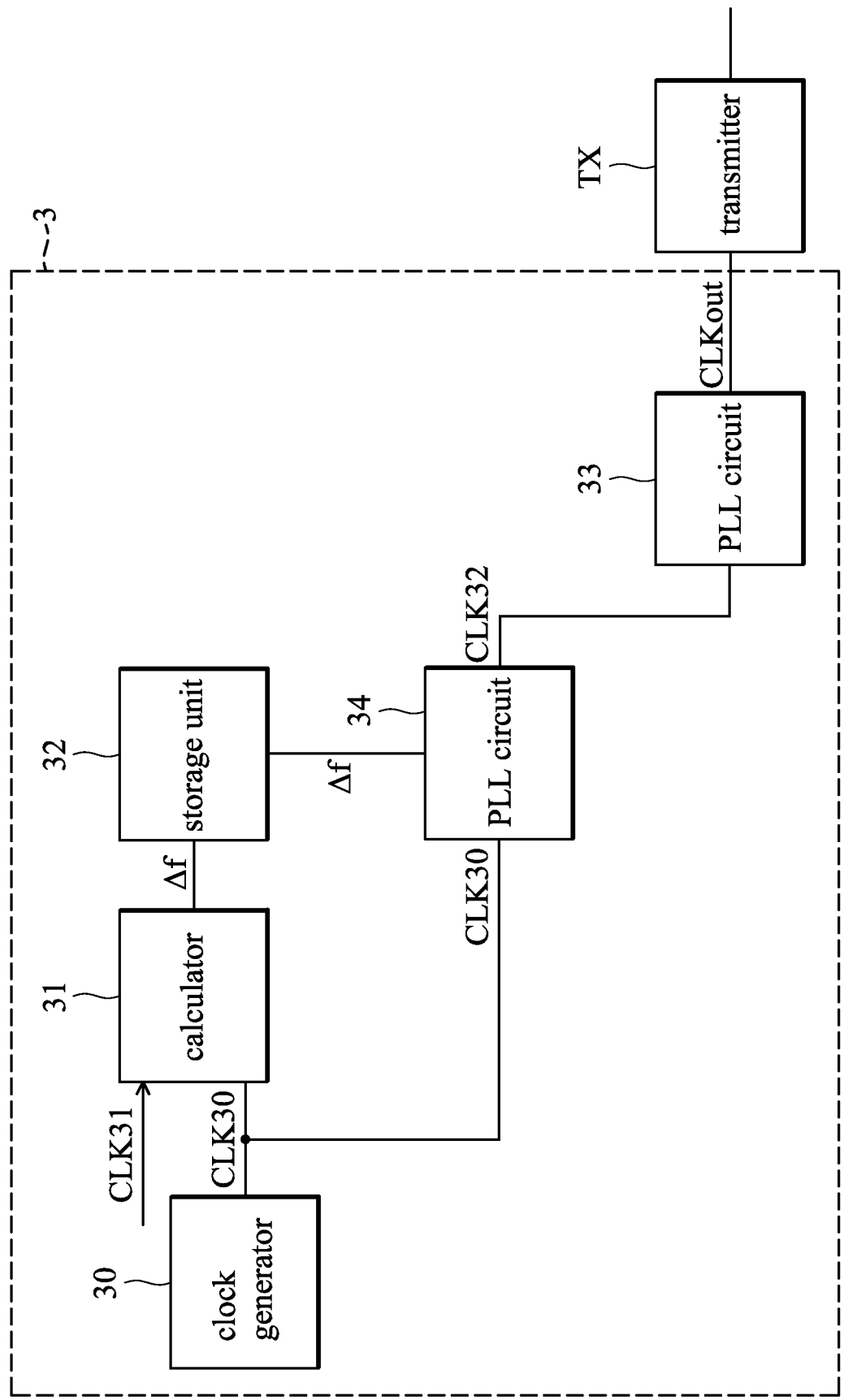
FIG. 3 shows another exemplary embodiment of a clock generation device.

FIG. 3 shows another exemplary embodiment of a clock generation device. A clock generation device 3 is arranged to generate an output clock signal CLKout, and then the output clock signal CLKout is provided to a transmitter TX, wherein the frequency of the output clock signal CLKout is expected to conform to a frequency ppm range defined by a required specification. The transmitter TX transmits data according to the output clock signal CLKout. Referring to FIG. 3, the clock generation device 3 comprises a clock generator 30, a calculator 31, a storage unit 32, and PLL circuits 33 and 34. The clock generator 30 generates a clock signal CLK30. The PLL circuit 34 receives the clock signal CLK30, which serves as a reference clock signal for the PLL circuit 34, and generates a clock signal CLK32 according to the reference clock signal (i.e. the clock signal CLK30). The PLL circuit 33 receives the clock signal CLK32, which serves as a reference clock signal for the PLL circuit 33, and generates the output clock signal CLKout according to the reference clock signal (i.e. the clock signal CLK32). In other words, the PLL circuit 33 eventually generates the output clock signal CLKout according to the clock signal CLK32 related to the clock signal CLK30.

When the frequency of the clock signal CLK30 does not conform to the defined frequency ppm range, the frequency of the clock signal CLK32 generated based on the clock signal CLK30 usually does not conform to the defined frequency ppm range as well. Similarly, the frequency of the output clock signal CLKout also does not conform to the defined frequency ppm range due to the clock signal CLK32. The calculator 31 receives the clock signal CLK30 and a precise clock signal CLK31. In the embodiment, the calculator 31 calculates a frequency difference Δf between the clock signals CLK30 and CLK31, and the storage unit 32 receives and stores the frequency difference Δf. The frequency of the clock signal CLK31 accurately conforms to the defined frequency ppm range since the clock signal CLK31 is typically provided from an external device in the embodiment outside the clock generation device 3 rather than an on-board clock or internal generated clock for the clock generation device 3. In other words, the clock signal CLK31 is not generated by an internal device, for example, a clock data recovery circuit which typically generates a clock signal according to the host data received from an external device; on the contrary, the clock signal CLK31 is directly and externally provided from a device outside the system which the clock generation device 3 is located in. More particularly, the clock signal CLK31 is externally provided in the manufacturing or testing of the clock generation device 3 so as to calculate the frequency differenceΔf between the clock signal CLK30 generated by an on-board clock source and the precise clock signal CLK31 before leaving the factory. In normal operation, the PLL circuit 34 adjusts the frequency of the clock signal CLK32 according to the frequency difference Δf initially stored in the storage unit 32, so that the frequency of the clock signal CLK32 is calibrated to conform to the defined frequency ppm range. In other words, the frequency of the clock signal CLK32 is changed according to the frequency difference Δf in order to conform to the defined frequency ppm range. In the embodiment, the frequency of the clock signal CLK32 is adjusted by controlling elements of the PLL circuit 34, such as a divider, and the frequency difference Δf might be present in various forms, such as an frequency compensation code provided for the divider or other elements in the PLL circuit 34. Then, the PLL circuit 33 receives the adjusted clock signal CLK32 that serves as its reference clock signal and generates the output clock signal CLKout according to the adjusted clock signal CLK32, so that the frequency of the output clock signal CLKout is indirectly adjusted to conform to the defined frequency ppm range. It is well known, that a PLL circuit requires a reference clock signal for generation of an output clock signal, and the frequency of the output clock signal is changed by the frequency shift of the reference clocks signal. In the embodiment, since the output clock signal CLKout is changed as the clock signal CLK32 is changed according to the frequency difference Δf, the frequency of the output clock signal CLKout is equivalently and eventually changed according to the frequency difference Δf Therefore, since the frequency of the output clock signal CLKout conforms to the defined frequency ppm range, the data transmitted by the transmitter TX meets the specification.

In the embodiment of FIG. 3, before a transmitter TX begins to transmits data, the frequency difference Δf is predetermined according to the precise clock signal CLK31, and the frequency of the output clock signal CLKout had been calibrated to conform to the defined frequency ppm range according to the predetermined frequency difference Δf. Thus, the transmitter TX transmits data using the calibrated output clock signal CLKout, and the transmitted data meets the required specification.

In some embodiments, the storage unit is 32 a hardware or a storage medium storing a firmware. The clock generator 30 is implemented by a crystal or resonator disposed on the same PCB or silicon substrate with other circuits of the clock generation device 3.

Figure 4:
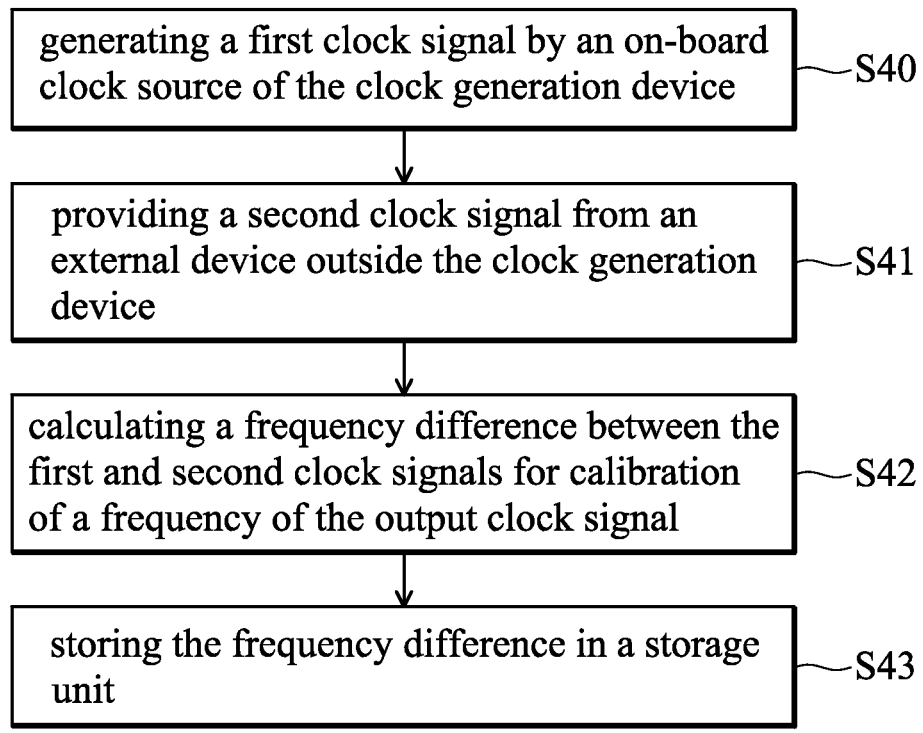
FIG. 4 is a flow chart of an exemplary embodiment of a clock generation method for a clock generation device.

FIG. 4 is a flow chart of an exemplary embodiment of a clock generation method illustrating a clock generation device provided for a transmitter which transmits data according to an output clock signal. An on-board clock source of the clock generation device generates a first clock signal (step S40). An external device outside the clock generation device provides a second clock signal (step S41), and, in the embodiment, the frequency of the second clock signal is within a range required for specification of the transmitter. A frequency difference between the first and second clock signals is calculated for calibration of a frequency of the output clock signal (step S42). Accordingly, the calibrated frequency of the output clock signal is within a range required for specification of the transmitter. In some embodiment, the calculated frequency difference can be stored in a storage unit (step S43).

Figure 5:
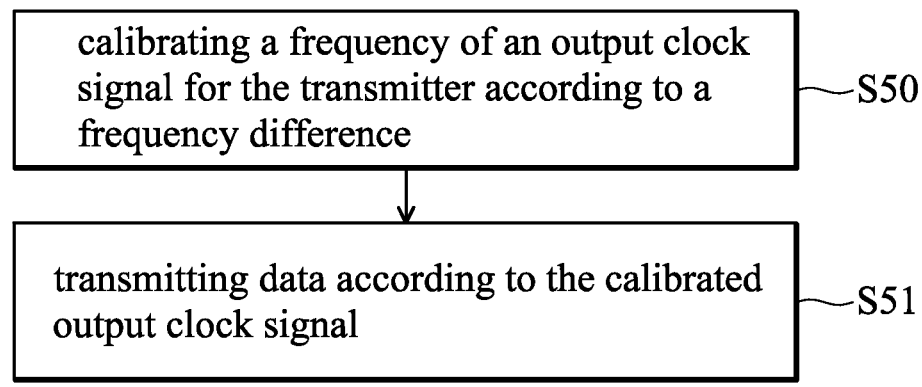
FIG. 5 is a flow chart of an exemplary embodiment of a data transmission method for a transmitter.

FIG. 5 is a flow chart of an exemplary embodiment of a data transmission method for a transmitter. A frequency of an output clock signal for the transmitter is calibrated according to a frequency difference (step S50). The transmitter transmits data according to the calibrated output clock signal (step S51). In this embodiment, before the step S51, the frequency difference is predetermined by calculating a frequency difference between a first clock signal and a precise clock signal. The first clock signal is generated by an on-board clock source of the transmitter. Each of the calibrated frequency of the output clock signal and the frequency of the precise clock signal is within a range required for specification of the transmitter. In some embodiments, the calculated frequency difference can be stored in a storage unit. Thus, the transmitter can transmit data with reference to the frequency difference previously calculated and stored in the storage unit without instantaneously calculating the frequency difference between the first clock signal and a precise clock signal.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A clock generation device provided for a transmitter, wherein the transmitter transmits data according to an output clock signal, the clock generation device comprising
    a clock generator for generating a first clock signal;
    a calculator for calculating a frequency difference signal representing a frequency difference between the first clock signal and a second clock signal;
    a first phase locked loop (PLL) circuit for generating the output clock signal based on the first clock signal and the frequency difference signal, wherein a frequency of the output clock signal is changed according to the frequency difference signal; and
    a second PLL circuit for generating a third clock signal according to the first clock signal and adjusting a frequency of the third clock signal according to the frequency difference signal, wherein the first PLL circuit is arranged to receive the third clock signal serving as a first reference clock signal.

2. The clock generation device as claimed in claim 1, wherein each adjusted frequency of the output clock signal and a frequency of the second clock signal is within a range required for specification of the transmitter.

3. The clock generation device as claimed in claim 1, wherein each of the adjusted frequency of the third clock signal and a frequency of the second clock signal is within a range required for specification of the transmitter.

4. The clock generation device as claimed in claim 1, wherein the clock generator is implemented by an on-board clock source.

5. The clock generation device as claimed in claim 1 further comprising a storage unit for storing the frequency difference signal.

6. The clock generation device as claimed in claim 5, wherein the storage unit is a storage medium storing a firmware.

7. The clock generation device as claimed in claim 1, wherein the second clock signal is provided from an external device outside the clock generation device.

8. A clock generation method for a transmitter, wherein the transmitter transmits data according to an output clock signal provided from a clock generation device, the clock generation method comprising:
    generating a first clock signal by an on-board clock source of the clock generation device, wherein the on-board clock source is implemented by a crystal or resonator;
    receiving the first clock signal, by a PLL circuit of the clock generation device, to serve as a reference clock signal of the PLL circuit; and
    generating the output clock signal, by the PLL circuit, based on both the reference clock signal and a frequency difference, wherein the frequency difference between the reference clock signal and a second clock signal is calculated in manufacturing or testing of the clock generation device before leaving factory for calibration of a frequency of the output clock signal, and wherein the second clock signal is provided from an external device outside the clock generation device.

9. The clock generating method as claimed in claim 8, wherein a frequency of the second clock signal is within a range required for specification of the transmitter.

10. A data transmission method for a transmitter, comprising:

receiving a first clock signal from an on-board clock source, by a PLL circuit of a clock generation device, to serve as a reference clock signal of the PLL circuit;

generating an output clock signal, by the PLL circuit, based on the reference clock signal;

calibrating, by the clock generation device, a frequency of the output clock signal for the transmitter according to a frequency difference to generate a calibrated output clock signal; and transmitting data, by the transmitter, according to the calibrated output clock signal;

wherein the frequency difference is calculated as a difference between a precise clock signal and the reference clock signal in manufacturing or testing of the clock generation device before leaving factory, and the on-board clock source is implemented by a crystal or resonator.

11. The data transmission method as claimed in claim 10, wherein the frequency difference is predetermined by calculating a frequency difference between a first clock signal and the precise clock signal.

12. The data transmission method as claimed in claim 11, wherein the first clock signal is generated by an on-board clock source of the transmitter.

13. The data transmission method as claimed in claim 10, wherein each of the calibrated frequency of the output clock signal and a frequency of the precise clock signal is within a range required for specification of the transmitter.

14. An integrated circuit embodying a clock generation device, the clock generation device comprising:

a clock generator for generating a first clock signal, wherein the clock generator is implemented by a crystal or resonator;

a storage unit for storing a frequency difference between the first clock signal and a second clock signal, and a PLL circuit for receiving the first clock signal to serve as a reference clock signal and generating an output clock signal based on the reference clock signal and the stored frequency difference;

wherein the stored frequency difference is calculated as a difference between the reference clock signal and a second clock signal in manufacturing or testing of the clock generation device before leaving a factory; and wherein the second clock signal is supplied by an external device, and the external device not being a part of the integrated circuit and being independent of a receiver circuit.

* * * * *